United States Patent
Hsu et al.

(10) Patent No.: US 8,232,903 B2
(45) Date of Patent: Jul. 31, 2012

(54) FINGER-SPLIT AND FINGER-SHIFTED TECHNIQUE FOR HIGH-PRECISION CURRENT MIRROR

(75) Inventors: Ying-Chih Hsu, Taichung (TW); Wen-Shen Chou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 110 days.

(21) Appl. No.: 12/771,327

(22) Filed: Apr. 30, 2010

(65) Prior Publication Data

US 2011/0267213 A1    Nov. 3, 2011

(51) Int. Cl.
*H03M 1/66* (2006.01)
(52) U.S. Cl. .................. 341/144; 341/120; 341/136
(58) Field of Classification Search .......... 341/120, 341/144, 118, 136, 153
See application file for complete search history.

(56) References Cited

U.S. PATENT DOCUMENTS

| 5,568,145 | A |   | 10/1996 | Reynolds |
| 5,844,515 | A | * | 12/1998 | Park .............................. 341/144 |
| 5,949,362 | A |   | 9/1999  | Tesch et al. |
| 6,563,444 | B2 | * | 5/2003 | Zhang et al. ................. 341/120 |
| 6,720,898 | B1 |   | 4/2004 | Ostrem |
| 6,927,714 | B1 |   | 8/2005 | Teterwak |
| 2009/0121910 | A1 | * | 5/2009 | Cheung et al. ............... 341/144 |

* cited by examiner

*Primary Examiner* — Jean B Jeanglaude
(74) *Attorney, Agent, or Firm* — Duane Morris LLP

(57) ABSTRACT

A current cell array includes a number of current cell groups arranged such that they extend in a first direction. Each of the current cell groups is identified by a first identifier that increases in a direction of a gradient across the current cell array. A number of current cells are included in each of the current cell groups. Each of the current cells is identified by a respective second identifier that increases in the direction of the gradient across the current cell array. The current cells are positioned in the current cell groups based on the first and second identifiers.

20 Claims, 9 Drawing Sheets

FIG. 2A
FIG. 2B
FIG. 2C
FIG. 2D

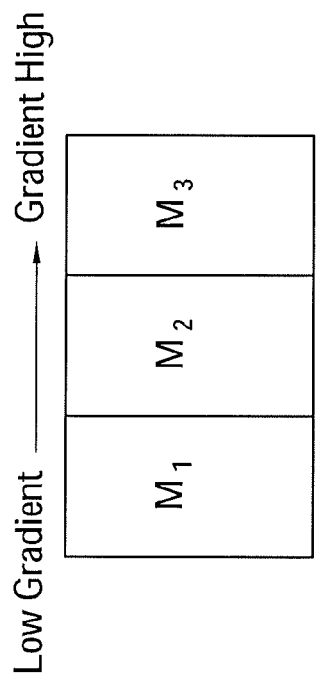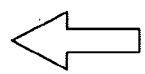

FIG. 5A

|  | $M_1$ | | | $M_2$ | | | $M_3$ | | |
|---|---|---|---|---|---|---|---|---|---|
| | $S_{1X}$ | $S_{2X}$ | $S_{3X}$ | $S_{1X}$ | $S_{2X}$ | $S_{3X}$ | $S_{1X}$ | $S_{2X}$ | $S_{3X}$ |
| $S_{1Y}$ | $M_1$ $S_{1X1Y}$ | $M_1$ $S_{2X1Y}$ | $M_1$ $S_{3X1Y}$ | $M_2$ $S_{1X1Y}$ | $M_2$ $S_{2X1Y}$ | $M_2$ $S_{3X1Y}$ | $M_3$ $S_{1X1Y}$ | $M_3$ $S_{2X1Y}$ | $M_3$ $S_{3X1Y}$ |
| $S_{2Y}$ | $M_1$ $S_{1X2Y}$ | $M_1$ $S_{2X2Y}$ | $M_1$ $S_{3X2Y}$ | $M_2$ $S_{1X2Y}$ | $M_2$ $S_{2X2Y}$ | $M_2$ $S_{3X2Y}$ | $M_3$ $S_{1X2Y}$ | $M_3$ $S_{2X2Y}$ | $M_3$ $S_{3X2Y}$ |
| $S_{3Y}$ | $M_1$ $S_{1X3Y}$ | $M_1$ $S_{2X3Y}$ | $M_1$ $S_{3X3Y}$ | $M_2$ $S_{1X3Y}$ | $M_2$ $S_{2X3Y}$ | $M_2$ $S_{3X3Y}$ | $M_3$ $S_{1X3Y}$ | $M_3$ $S_{2X3Y}$ | $M_3$ $S_{3X3Y}$ |

⇒ X-Axis Split and Shift

FIG. 5B

|  | $M_1'$ | | | $M_2'$ | | | $M_3'$ | | |
|---|---|---|---|---|---|---|---|---|---|
| | $S_{1X}'$ | $S_{2X}'$ | $S_{3X}'$ | $S_{1X}'$ | $S_{2X}'$ | $S_{3X}'$ | $S_{1X}'$ | $S_{2X}'$ | $S_{3X}'$ |
| $S_{1Y}$ | $M_1$ $S_{1X1Y}$ | $M_2$ $S_{1X1Y}$ | $M_3$ $S_{1X1Y}$ | $M_3$ $S_{2X1Y}$ | $M_1$ $S_{2X1Y}$ | $M_2$ $S_{2X1Y}$ | $M_2$ $S_{3X1Y}$ | $M_3$ $S_{3X1Y}$ | $M_1$ $S_{3X1Y}$ |
| $S_{2Y}$ | $M_1$ $S_{1X2Y}$ | $M_2$ $S_{1X2Y}$ | $M_3$ $S_{1X2Y}$ | $M_3$ $S_{2X2Y}$ | $M_1$ $S_{2X2Y}$ | $M_2$ $S_{2X2Y}$ | $M_2$ $S_{3X2Y}$ | $M_3$ $S_{3X2Y}$ | $M_1$ $S_{3X2Y}$ |
| $S_{3Y}$ | $M_1$ $S_{1X3Y}$ | $M_2$ $S_{1X3Y}$ | $M_3$ $S_{1X3Y}$ | $M_3$ $S_{2X3Y}$ | $M_1$ $S_{2X3Y}$ | $M_2$ $S_{2X3Y}$ | $M_2$ $S_{3X3Y}$ | $M_3$ $S_{3X3Y}$ | $M_1$ $S_{3X3Y}$ |

FIG. 5C

| $M_1'$ | | | $M_2'$ | | | $M_3'$ | | |
|---|---|---|---|---|---|---|---|---|
| $M_1$ $S_{1X1Y}$ | $M_3$ $S_{1X1Y}$ | $M_3$ $S_{2X1Y}$ | $M_1$ $S_{2X1Y}$ | $M_2$ $S_{2X1Y}$ | $M_2$ $S_{3X1Y}$ | $M_3$ $S_{3X1Y}$ | $M_1$ $S_{3X1Y}$ | $S_{1Y}$ |
| $M_1$ $S_{1X2Y}$ | $M_3$ $S_{1X2Y}$ | $M_3$ $S_{2X2Y}$ | $M_1$ $S_{2X2Y}$ | $M_2$ $S_{2X2Y}$ | $M_2$ $S_{3X2Y}$ | $M_3$ $S_{3X2Y}$ | $M_1$ $S_{3X2Y}$ | $S_{2Y}$ |
| $M_1$ $S_{1X3Y}$ | $M_3$ $S_{1X3Y}$ | $M_3$ $S_{2X3Y}$ | $M_1$ $S_{2X3Y}$ | $M_2$ $S_{2X3Y}$ | $M_2$ $S_{3X3Y}$ | $M_3$ $S_{3X3Y}$ | $M_1$ $S_{3X3Y}$ | $S_{3Y}$ |

⇩ ⇩ ⇩ Y-Axis Split and Shift

FIG. 5D

| $M_1'$ | | | $M_2'$ | | | $M_3'$ | | |
|---|---|---|---|---|---|---|---|---|
| $M_1$ $S_{1X1Y}$ | $M_3$ $S_{1X1Y}$ | $M_3$ $S_{2X3Y}$ | $M_1$ $S_{2X3Y}$ | $M_2$ $S_{2X3Y}$ | $M_2$ $S_{3X2Y}$ | $M_3$ $S_{3X2Y}$ | $M_1$ $S_{3X2Y}$ | $S_{1Y}'$ |
| $M_1$ $S_{1X2Y}$ | $M_3$ $S_{1X2Y}$ | $M_3$ $S_{2X1Y}$ | $M_1$ $S_{2X1Y}$ | $M_2$ $S_{2X1Y}$ | $M_2$ $S_{3X3Y}$ | $M_3$ $S_{3X3Y}$ | $M_1$ $S_{3X3Y}$ | $S_{2Y}'$ |
| $M_1$ $S_{1X3Y}$ | $M_3$ $S_{1X3Y}$ | $M_3$ $S_{2X2Y}$ | $M_1$ $S_{2X2Y}$ | $M_2$ $S_{2X2Y}$ | $M_2$ $S_{3X1Y}$ | $M_3$ $S_{3X1Y}$ | $M_1$ $S_{3X1Y}$ | $S_{3Y}'$ | ded to provide current cell arrays including N

FINGER-SPLIT AND FINGER-SHIFTED TECHNIQUE FOR HIGH-PRECISION CURRENT MIRROR

FIELD OF DISCLOSURE

The disclosed system and method relate to a current source digital-to-analog converter (DAC). More specifically, the disclosed system and method relate to the physical arrangement of the current cells of a current cell array to provide a current-steering DAC having improved precision.

BACKGROUND

DACs are widely implemented in integrated circuits (ICs). For example, DACs may be used in cellular base stations, test equipment, waveform generators, and in wireless communication systems. Binary-weighted DACs include a number of taps that receive different binary-weighted currents and a series of switches coupled to the taps. The opening and closing of the switches are controlled by an input code, which in turn controls the output current.

Thermometer codes have been implemented to reduce transient glitch energy problems associated with switching in binary-weighted DACs. U.S. Pat. No. 5,568,145 issued to Reynolds, which is incorporated by reference herein in its entirety, discusses the use of thermometer codes in binary-weighted DACs. The arrangement of the current sources in the binary-weight DAC array affects the precision of the DAC. For example, fluctuations in threshold voltages and carrier charge mobility cause random mismatches between current sources. Additionally, gradients in oxide thickness, mechanical stress, and resistive voltage drops in supply lines cause linear, parabolic, and higher order gradients across the current source array.

U.S. Pat. No. 6,720,898 issued to Ostrem, which is incorporated by reference herein in its entirety, discloses a layout for a current source array of a binary-weighted DAC for minimizing parabolic errors as well as third harmonic distortions. However, the layout set forth by Ostrem may only be applied to two-dimensional current cell arrays and requires complex routing.

Accordingly, an improved layout and method for binary-weighted DACs are desirable.

SUMMARY

A current cell array is disclosed that includes a number of current cell groups arranged such that they extend in a first direction. Each of the current cell groups is identified by a first identifier that increases in a direction of a gradient across the current cell array. A number of current cells are included in each of the current cell groups. Each of the current cells is identified by a respective second identifier that increases in the direction of the gradient across the current cell array. The current cells are positioned in the current cell groups based on the first and second identifiers.

A method is also disclosed in which an initial current cell array including a plurality of current cells is provided. A plurality of current cells of the current cell array are grouped into a plurality of groups. A first identifier is assigned to each of the groups of current cells and a second identifier to each of the current cells in each of the groups of current cells. The first and second identifiers are based on a gradient of the initial current cell array. The current cells are arranged based on the first and second identifiers to provide a layout for a final current cell array. The final current cell array layout is stored in a computer readable storage medium.

Also disclosed is a current cell array including a plurality of current cells that is formed by a method. The method includes providing an initial current cell array including the plurality of current cells extending in first and second directions, and grouping a first plurality of current cells of the current cell array into a plurality of groups. Each of the groups includes current cells extending in the first and second directions. A first identifier is assigned to each of the groups of current cells based on a respective position of each group of current cells with respect to a gradient of the initial current cell array in the first direction. A second identifier is assigned to each of the current cells in each of the groups of current cells based on a respective position of the current cell within a respective group of current cells with respect to the gradient in the first direction. A third identifier is assigned to each of the current cells in each of the groups of current cells based on a respective position of the current cell within a respective group of current cells with respect to a gradient in a second direction. The current cells are arranged in the first direction based on the first and second identifiers to provide an initial layout of the current cell array. The current cells are arranged in the second direction based on the first and third identifiers to provide a final layout of the current cell array. The final layout of the current cell array is stored in a computer readable storage medium.

BRIEF DESCRIPTION OF THE DRAWINGS

FIG. 2A-2D are block diagrams of one example of a matching technique in an x-direction.

FIG. 3A-3D are block diagrams of one example of a matching technique in a y-direction.

FIG. 5A-5D are block diagrams illustrating the matching technique in the x- and y-directions.

DETAILED DESCRIPTION

The disclosed arrays of current source cells and method of forming the cell arrays provide improved matching within the fingers of an array and reduce the complexity compared to conventional arrays and methods of forming the arrays. The method may be applied to any current cell array of one or more dimensions that includes three or more main groups, with each main group, M, having at least three sub-groups, S.

Figure 1:
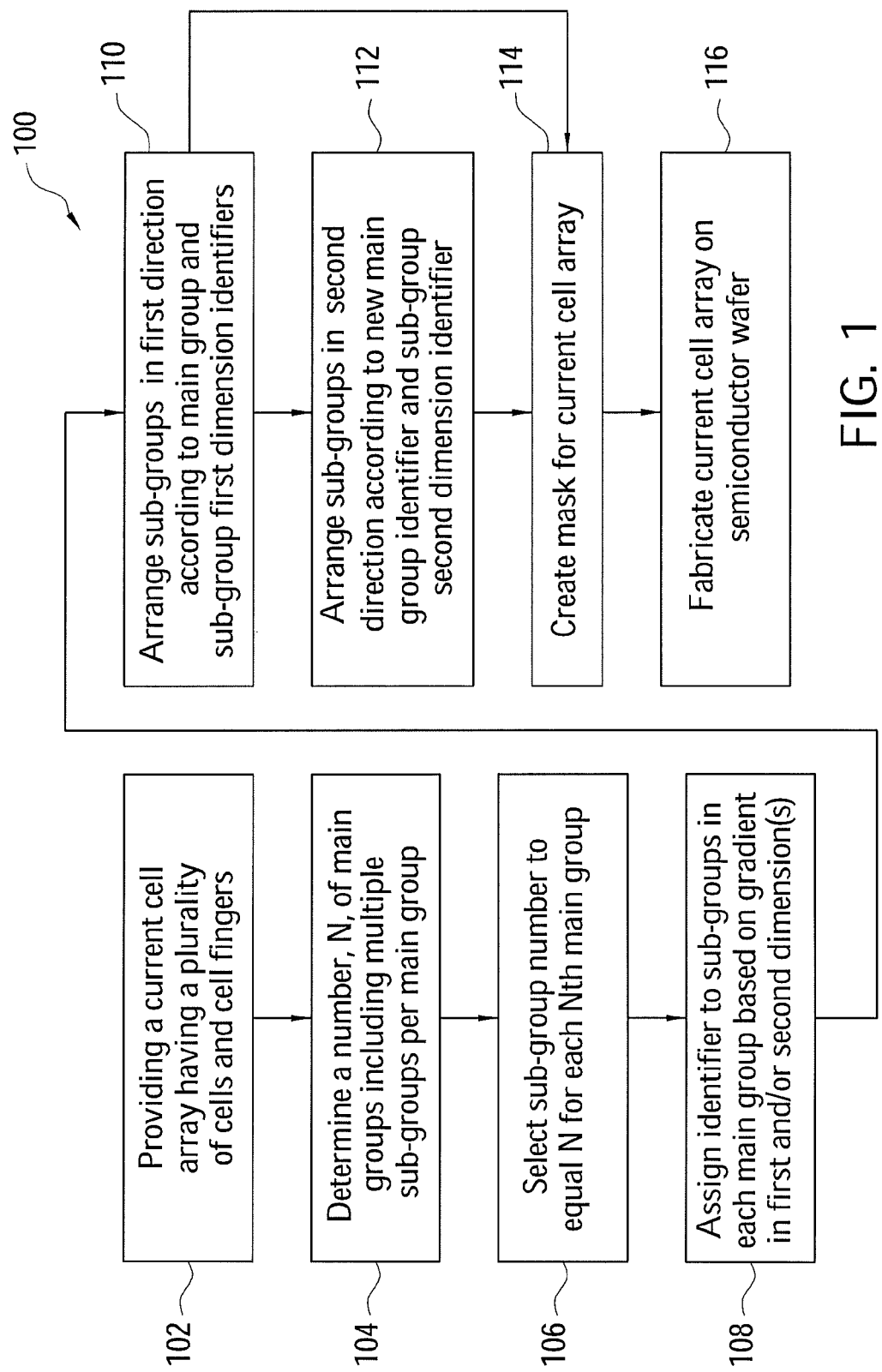
FIG. 1 is a flow diagram of one example of a method of arranging the current cells in a current cell array.

The method of designing and fabricating an improved current cell array is described with reference to FIG. 1. At block 102, a current cell array is provided including a plurality of current cells.

At block 104, a number, N, of main groups, M, are defined according to the number of current sources are applied, where N is an integer greater than or equal to three. Each main group, M, is selected to include N fingers or N sub-groups of fingers for matching purposes at block 106. At block 108, the position identifiers in a first direction, e.g., along the x- or y-axis, from one to N are defined based on the gradient due to processing or routing parasitics to provide current cell arrays including N sub-groups and N gradient-related identifiers within each of the N main groups. A position identifier, Y, is also assigned in a second direction if the shift is to be performed in both directions. Each sub-group in the original array is identified by a combination of the main group identifier and the sub-group identifier in the first direction, i.e., $M_K S_{XY}$, where K is the main group identifier, X is the sub-group identifier in the first direction, and Y is the sub-group in the second direction. Note that X and Y do not necessarily correspond to the x- and y-axes, but merely correspond to the first and second directions in which the array extends.

The sub-groups of each of the N main groups are rearranged at block 110 to provide matching across the current cells in the first direction. For example, each sub-group is moved into a new location, $M_I' S_X'$, based on the main group identifier, K, and the sub-group identifier in the first direction, X, in accordance with the following equations:

$$M_K S_X = M_{X'} S_{K+X-1}', \text{ if } K+X-1 \leq N \quad \text{Eq. 1}$$

$$M_K S_X = M_{X'} S_{K+X-1-N}', \text{ if } K+X-1 > N \quad \text{Eq. 2}$$

If the current cell array extends in only a single dimension, e.g., in an x-, y-, or other dimension, then the method proceeds to block 114 where a mask of the current cell array is created. The current cell array is then fabricated on a semiconductor wafer at block 116.

If the current cell array extends in two directions, then the method proceeds to block 112. At block 112, the sub-groups are arranged in based on the new main-group identifier, $M_K'$ and the sub-group identifier in the second direction, Y, in accordance with the following equations:

$$M_K' S_Y = M_K' S_{K'-Y-1}', \text{ if } K'+Y-1 \leq N \quad \text{Eq. 3}$$

$$M_K' S_Y = M_K' S_{K'-1-N}', \text{ if } K'+Y-1 > N \quad \text{Eq. 4}$$

Where,

K' is the new main group identifier after the shift in the first direction;

Y is the sub-group identifier for the second dimension; and

N is the total number of main groups and sub-groups per main group in a certain direction.

Once arranged, a mask for the current cell array is created at block 114, and the current cell array is fabricated on a semiconductor wafer at block 116.

FIG. 2A-2D illustrate the matching technique in single dimension, which in the illustrated example is the x-dimension. As shown in FIG. 2A, the current cell array includes three current cells, $M_1$, $M_2$, and $M_3$. The gradient in FIG. 2A is illustrate such that the gradient at current cell $M_3$ is higher than the gradient at current cell $M_1$. In FIG. 2B, the three current cells, $M_1$, $M_2$, and $M_3$ are illustrated such that each current cell includes three fingers or sub-groups extending in a first direction, $M_1 S_1$, $M_1 S_2$, $M_1 S_3$, $M_2 S_1$, $M_2 S_2$, $M_2 S_3$, $M_3 S_1$, $M_3 S_2$, and $M_3 S_3$.

FIG. 2C illustrates the fingers of the current cell array in FIG. 2B having been split and redistributed to more evenly distribute the gradient across the current cell array in accordance with Equations 1 and 2 set forth above. As shown in FIG. 2C, sub-group $M_1 S_1$ is still in its initial position, i.e., the first position in the first main group. For example, $M_1 S_1$ has a main group identifier, K, equal to one, and an first direction sub-group identifier X, which is also equal to one. Since K+X−1 equals one, which is less than N, which in this example is equal to three, the position of $M_1 S_1$ is determined in accordance with Equation 1. Accordingly, the new position for $M_1 S_1$ is determined by $M_1' S_{1+1-1}'$, which yields the same position, i.e., $M_1' S_1'$. The first sub-group in the second main group, $M_2 S_1$, is then positioned directly adjacent to the first sub-group of the first main group, $M_1 S_1$, as shown in FIG. 2C in accordance with Equation 1. For example, the position of $M_2 S_1$ is determined by $M_1' S_{2+1-1}'$, which yields a new position of $M_1' S_2'$. The sub-group in the second position of the third main group, $M_3 S_2$, is moved to the first position in the second sub-group, i.e., $M_2' S_1'$, in accordance with Equation 2 since 3+2−1 is greater than N, which in this example is three. In this manner, the sub-groups of the current cell array are redistributed to provide matching across the array. The final array with the new positions is shown in FIG. 2D.

FIGS. 3A-3D illustrate the matching technique applied in a first direction, which is along the y-axis. As shown in FIG. 3A, three current cells $M_1$, $M_2$, and $M_3$. The gradients in FIG. 3A are illustrated such that the gradient at current cell $M_3$ is higher than the gradient at current cell $M_1$. In FIG. 3B, the three current cells, $M_1$, $M_2$, and $M_3$ are illustrated such that each current cell extending in the first direction along the y-axis includes three fingers or sub-groups, $M_1 S_1$, $M_1 S_2$, $M_1 S_3$, $M_2 S_1$, $M_2 S_2$, $M_2 S_3$, $M_3 S_1$, $M_3 S_2$, and $M_3 S_3$. The gradient is shown as in FIG. 3B such that the first dimension sub-group identifier increases as the gradient increases, i.e., the gradient increases from the top of the array to the bottom of the array.

FIG. 3C illustrates the sub-groups being repositioned in accordance with Equations 3 and 4 set forth above. For example, the sub-group in the first position of the first main group, $K_1 S_3$, is arranged in accordance with Equation 3, which provides that the sub-group stays in the same position of the same main group since $M_{X'} S_{K+X-1} = M_1' S_{1+1-1}' = M_1' S_1'$. The second sub-group in the second position of the third main group, $M_2 S_3$, is shifted in accordance with Equation 4 since 2+3−1 is greater than N, which in this example is three. Accordingly, sub-group $M_2 S_3$ is moved to the first position of the third main group, i.e., position $M_2' S_1'$, in accordance with Equation 2. Each of the sub-groups are arranged in the same manner to provide matching across the array as shown in FIG. 3C. The final array with the new positions is shown in FIG. 3D.

Figure 4:
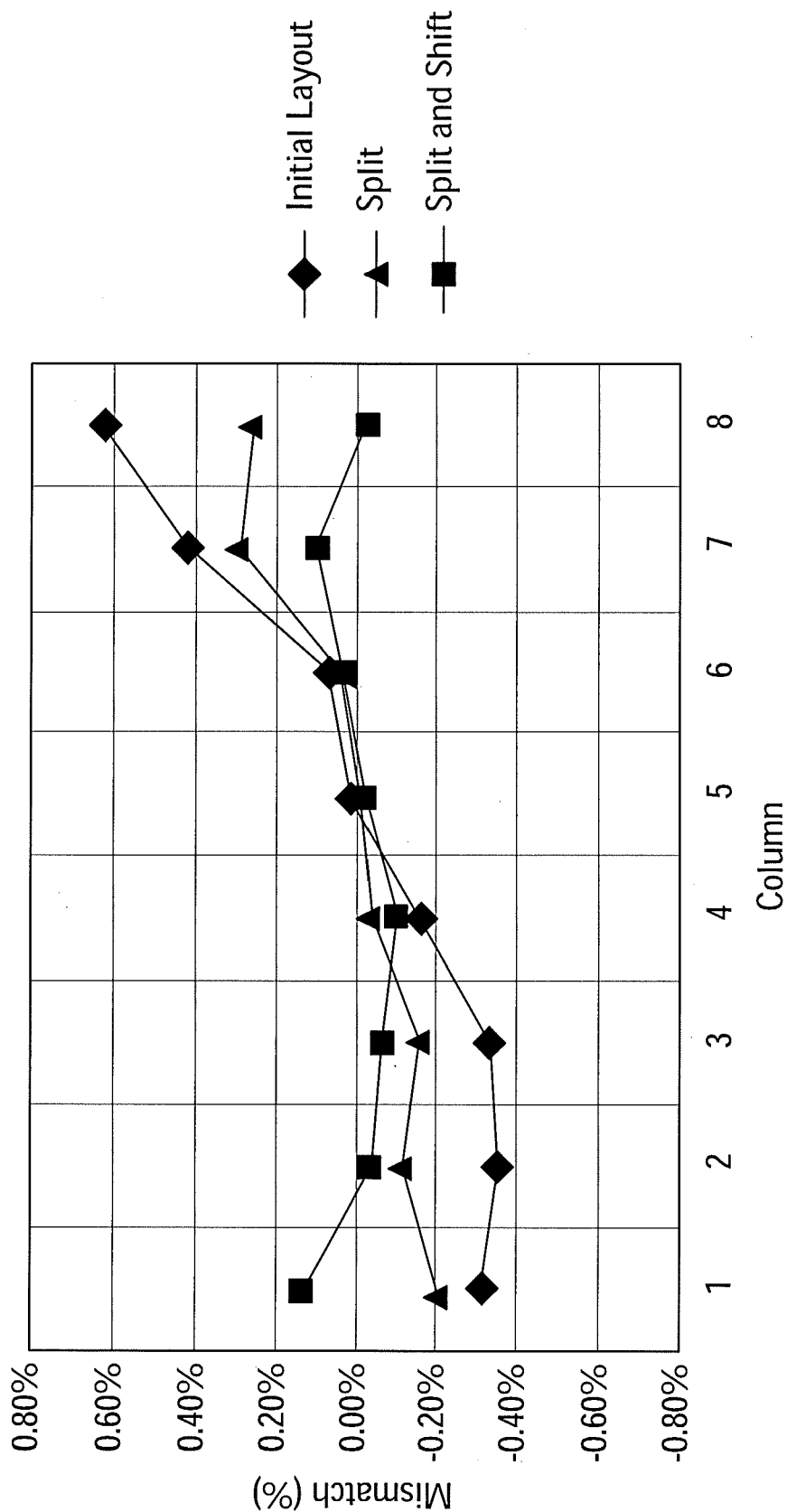
FIG. 4 is a graph illustrating the improvement of the matching and shifting technique described herein.

As shown in FIG. 4, the split and shifted layout described herein provides lower output mismatch compared to the layout without matching or the layout in which the fingers are only redistributed and not shifted.

The methodology described above may also be applied to cell arrays in which the cells extend in more than one dimension as will be described with reference to FIGS. 5A-5D. FIG. 5A illustrates one example of an initial layout of cell array including three main groups $M_1$, $M_2$, and $M_3$ each having three sub-groups extending in both the x- and y-directions for a total of nine sub-groups per main group. As shown in FIG. 5A, each of the sub-groups are assigned a sub-group identifier in both directions, i.e., $M_1 S_{1X1Y}$, $M_1 S_{2X1Y}$, $M_1 S_{1X2Y}$, etc.

FIG. 5B illustrates the array after a split and shift has been performed in the first direction, which in this example is along the x-axis, in accordance with Equations 1 and 2. As shown in FIG. 5B, the sub-groups having a position identifier one in the first direction, i.e., 1X, in each of the main groups, $M_1$, $M_2$, and $M_3$, are repositioned into the first main group in ascending order based on their main group identifier. For example, the sub-groups in the first position in the first direction in the first main group, i.e., $M_1 S_{1X1Y}$, $M_1 S_{1X2Y}$, and $M_1 S_{1X3Y}$, maintain their initial positions since $M_{X'} S_{K+X-1}'$ is equal to $M_1 ' S_{1+1-1}'$, which yields $M_1' S_{1X'}$. The sub-groups in the first position in the first direction in the second main group, i.e., $M_2 S_{1X1Y}$, $M_2 S_{1X2Y}$, and $M_2 S_{1X3Y}$, are shifted to the second position in the first main group since $M_{X'} S_{K+X-1}'$ is equal to $M_1' S_{2+1-1}'$, which provides $M_1' S_{2X'}$ in accordance with Equation 1.

The sub-groups in the second position, i.e., 2X, in each of the main groups, $M_1$, $M_2$, and $M_3$, are shifted into the second main group, $M_2'$. The sub-groups in the second position in the third main group, i.e., $M_3S_{2X1}$, $M_3S_{2X2}$, and $M_3S_{2X3}$, are shifted in the first position of the second main group in accordance with Equation 2 since $M_X'S_{K+X-1-N}'$ is equal to $M_2'S_{3+2-1-3}'$ which yields $M_2'S_{1X}'$. The sub-groups in the second position of the second main group are shifted to the third position of the second main group, and the sub-groups in the second position in the first main group are shifted into the second position of the second main group as shown in FIG. 5B.

The sub-groups in the third positions, i.e., 3X, in each of the main groups, i.e., M are shifted into the third main group. The sub-groups in the third position of the first main group, i.e., $M_1S_{3X1}$, $M_1S_{3X2}$, and $M_1S_{3X3}$, are shifted to the third position in the third main group since $M_X'S_{K+X-1-N}'$ is equal to $M_3'S_{1+3-1}'$ yields $M_3'S_3'$. The sub-groups in the third position of the second main group are shifted into the first position of the third main group and the sub-groups in the third position of the third main group are shifted into the second position in the third main group in accordance with Equation 2 as shown in FIG. 5B.

FIG. 5C illustrates the array as the sub-groups in the second direction, i.e., along the y-axis, are identified for each of the main groups, $M_1'$, $M_2'$, and $M_3'$. FIG. 5D illustrates the array after the sub-groups have been shifted based on the new main group identifier, e.g., the main group identifier resulting from the shift in the first direction, and the sub-group identifier for the second direction in accordance with Equations 3 and 4.

As shown in FIG. 5D, the sub-groups in the first main group, $M_1'$, do not change position and none of the sub-groups are shifted into another main group. The sub-groups in the first position, i.e., 1Y, of the second main group, i.e., $M_2'$, are shifted into the second position of the second main group, since $M_K'S_{K'+Y-1}'$ is equal to $M_2'S_{2+1-1}'$, which yields $M_2'S_2'$ in accordance with Equation 1. The sub-groups in the second position, i.e., 2Y, of the second main group, $M_2'$, are shifted into the third position, and the sub-groups in the third position, i.e., 3Y, in the second main group, $M_2'$, are shifted into the first position. In the third main group, $M_3'$, the sub-groups in the first position, 1Y, are shifted to the third position, the sub-groups in the second position, 2Y, are shifted to the first position, and the sub-groups in the third position, 3Y, are shifted to the second position in accordance with Equations 3 and 4.

Figure 6A:
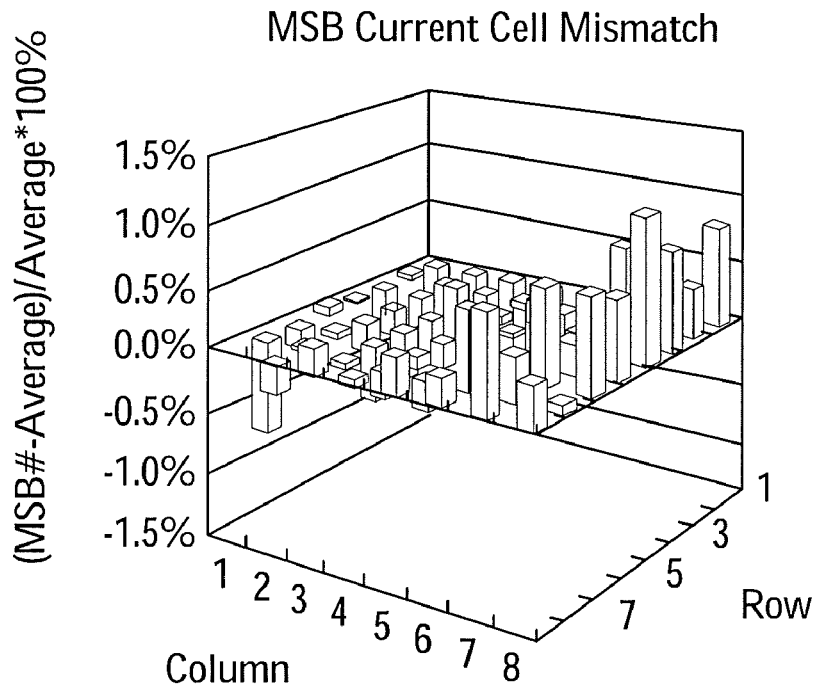
FIGS. 6A-6C are graphs illustrating he mismatch between columns of current cells.
Figure 6B:
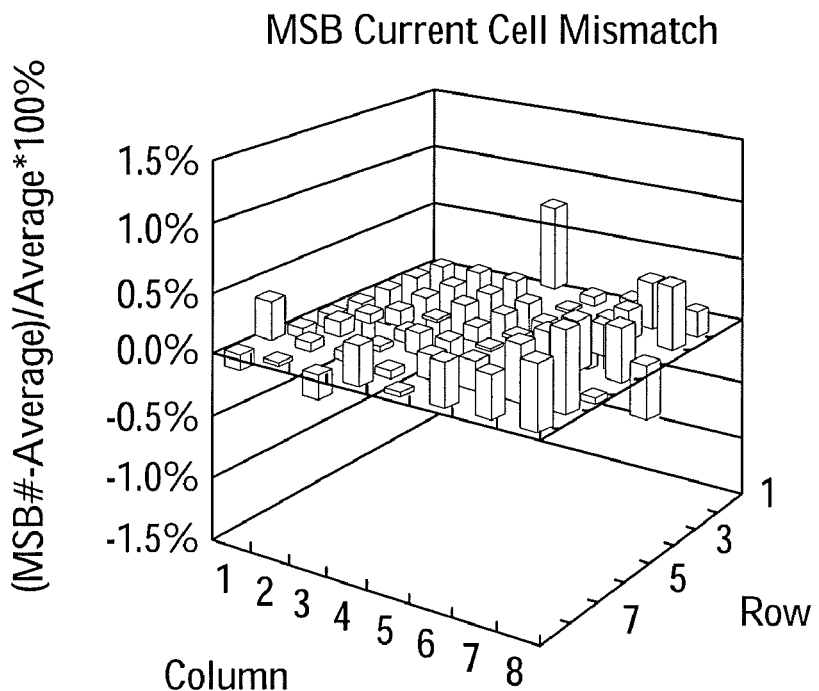
Figure 6C:
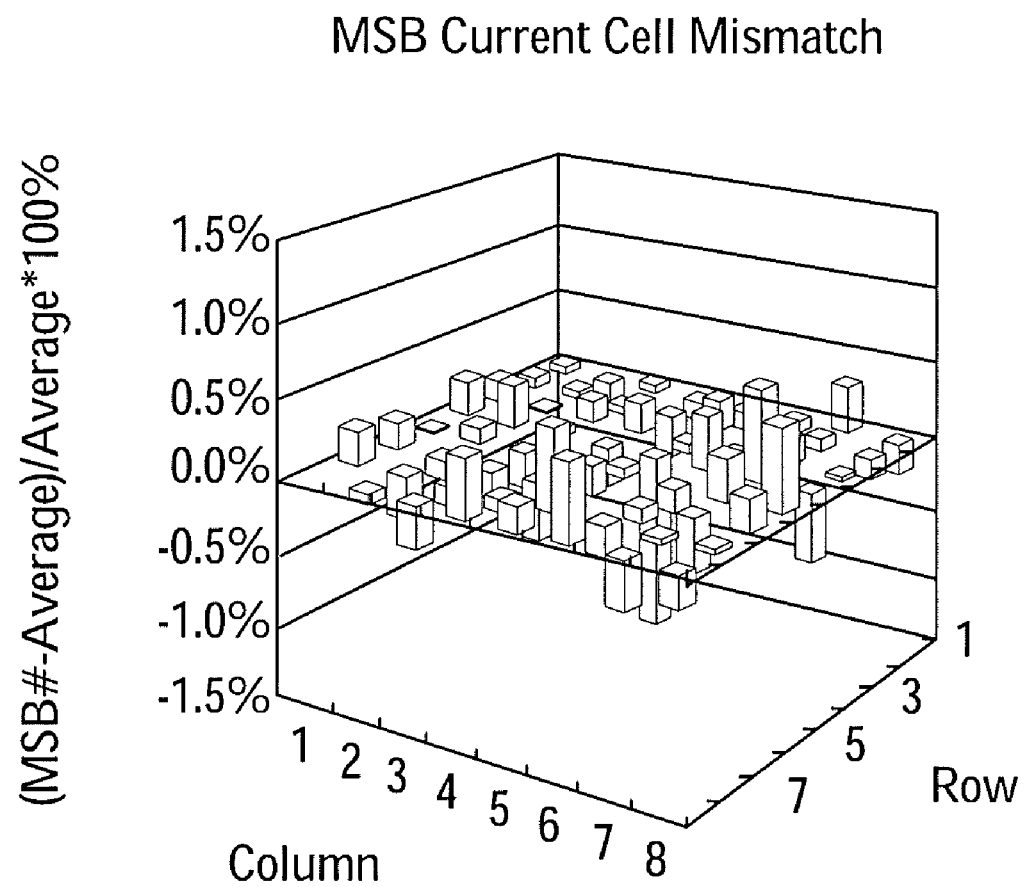

FIGS. 6A-6C are three dimensional graphs of mismatch between MSBs in an 8 by 8 current cell array. Specifically, FIG. 6A is a graph showing the mismatch between MSBs in an 8×8 current cell array in which the fingers are matched; FIG. 6B is a graph showing the mismatch between MSBs in an 8×8 current cell array in which the fingers are matched and redistributed; and FIG. 6C is a graph showing the mismatch between MSBs in an 8×8 current cell array in which the matched and redistributed fingers are arrayed in accordance with Equations 1-4. As shown in FIGS. 6A-6C, the 8×8 array in which the fingers are matched, redistributed, and array in accordance with Equations 1-4 experiences less mismatch between adjacent cells.

Figure 7:
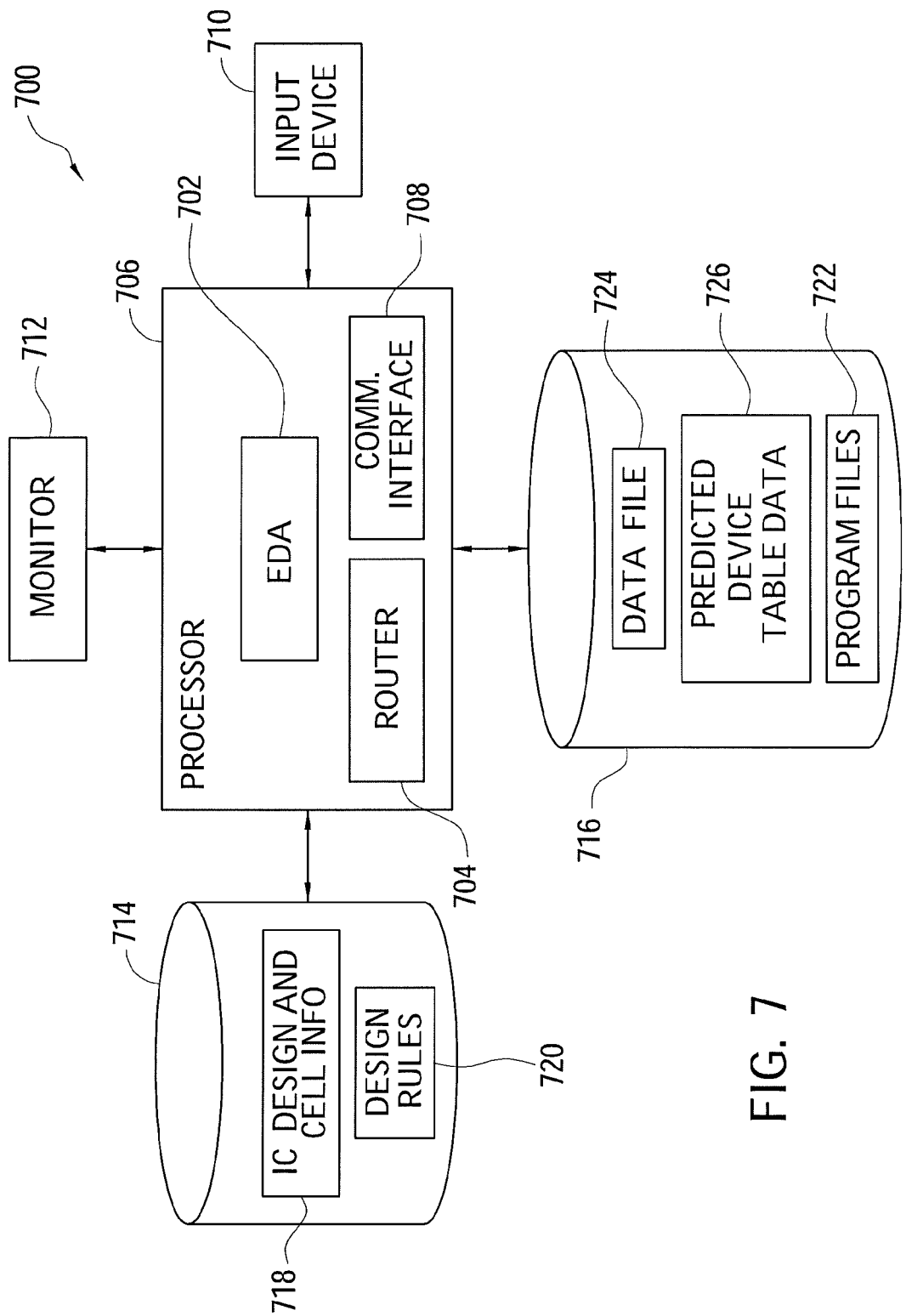
FIG. 7 is a block diagram of one example of a system for designing a current cell array.

The design method 100 described above may be performed using a system, such as the computer-based system 700 illustrated in FIG. 7. As shown in FIG. 7, the system 700 may include an electronic design automation tool 702 such as "IC COMPILER"™, sold by Synopsis, Inc. of Mountain View, Calif., having a router 704 such as "ZROUTE"™, also sold by Synopsis. Other EDA tools 702 may be used, such as, for example, the "VIRTUOSO" custom design platform or the Cadence "ENCOUNTER"® digital IC design platform along with the "VIRTUOSO" chip assembly router 704, all sold by Cadence Design Systems, Inc. of San Jose, Calif.

The EDA tool 702 is a special purpose computer formed by retrieving stored program instructions 722 from a computer readable storage mediums 714, 716 and executing the instructions on a general purpose processor 706. Processor 706 may be any central processing unit (CPU), microprocessor, microcontroller, or computational device or circuit for executing instructions. Processor 706 may be configured to perform circuit simulations based on a plurality of data stored in the one or more computer readable storage mediums 714, 716.

The computer readable storage medium 714, 716 may include one or more of registers, a random access memory (RAM) and/or a more persistent memory, such as a ROM. Examples of RAM include, but are not limited to, SRAM or dynamic random-access memory (DRAM). A ROM may be implemented as a programmable read-only memory (PROM), an erasable programmable read-only memory (EPROM), an electrically erasable programmable read-only memory (EEPROM), magnetic or optical storage media, as will be understood by one skilled in the art.

System 700 may include a monitor 710 and a user interface or input device 712 such as, for example, a mouse, a touch screen, a microphone, a trackball, a keyboard, or like device through which a user may input design instructions and/or data. The one or more computer readable storage mediums 714, 716 may store data input by a user, design rules 720, IC design and cell information 718, and data files 726, such as GDSII files, representing a physical layout of a circuit. Computer readable storage mediums 714, 716 may also store various transistor models in a variety of formats including, but not limited to, BSIM3, BSIM4, PSP, and HiSIM to name a few.

EDA tool 702 may include a communication interface 708 allowing software and data to be transferred between EDA tool 702 and external devices. Example communications interfaces 708 include, but are not limited to, modems, Ethernet cards, wireless network cards, Personal Computer Memory Card International Association (PCMCIA) slots and cards, or the like. Software and data transferred via communications interface 708 may be in the form of signals, which may be electronic, electromagnetic, optical, or the like that are capable of being received by communications interface 708. These signals may be provided to communications interface 708 via a communication path (e.g., channel), which may be implemented using wire, cable, fiber optics, a telephone line, a cellular link, a radio frequency (RF) link, to name a few.

The router 704 is capable of receiving an identification of a plurality of circuit components to be included in an integrated circuit (IC) layout including a list of pairs of cells, macro blocks or I/O pads within the plurality of circuit components to be connected to each other. A set of design rules 720 may be used for a variety of technology nodes (e.g., technology greater than, less than, or equal to 32 nm). In some embodiments, the design rules 720 configure the router 704 to locate connecting lines and vias on a manufacturing grid.

The present invention may be embodied in the form of computer-implemented processes and apparatus for practicing those processes. The present invention may also be embodied in the form of computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for practicing the invention. The present invention may also be embodied in the form of computer program code loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The invention may alternatively be embodied in a digital signal processor formed of application specific integrated circuits for performing a method according to the principles of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A current cell array, comprising:
a number of current cell groups arranged such that they extend in a first direction, each of the current cell groups identified by a first identifier that increases in a direction of a gradient across the current cell array;
a number of current cells in each of the current cell groups, each of the current cells identified by a respective second identifier that increases in the direction of the gradient across the current cell array,
wherein the current cells are positioned in the current cell groups based on the first and second identifiers, each positioned current cell group includes a current cell from each of the current cell groups prior to being positioned, and each current cell group has an arrangement that differs from a directly adjacent current cell group.

2. The current cell array of claim 1, wherein the current cells are positioned in the current cell groups in the first direction in accordance with the following:

$$M_K S_X = M_X' S_{k+x-1}', \text{ if } K+X-1 \leq N,$$

$$M_X S_X = M_X' S_{K+X-1-N}', \text{ if } K+X-1 > N$$

wherein
$M_K S_X$ identifies an initial position of a current cell,
$M_K' S_X'$ identifies a position of a current cell after being positioned in the first direction,
M identifies a group of current cells,
S identifies a current cell within a group of current cells,
K is the first identifier,
X is the second identifier, and
N is equal to the number of current cell groups and to the number of current cells per current cell group in the first direction.

3. The current cell array of claim 2, wherein each current cell group includes N current cells in the first direction and in a second direction.

4. The current cell array of claim 3, wherein each of the current cells includes a third identifier for positioning the current cells in a second direction.

5. The current cell array of claim 4, wherein the current cells are positioned in the second direction in accordance with the following:

$$M_K' S_Y = M_K' S_{K'+Y-1}', \text{ if } K'+Y-1 \leq N$$

$$M_K' S_Y = M_K' S_{K'+Y-1-N}', \text{ if } K'+Y-1 > N$$

wherein
K' is the first identifier after the current cells have been positioned in the first direction,
Y is the third identifier, and
N is equal to the number of current cell groups and the number of current cells per current cell group in the first and second directions.

6. The current cell array of claim 5, wherein each current cell group including the current cells positioned in the first and second directions includes a current cell from each current cell group prior to being positioned.

7. A method, comprising:
providing an initial current cell array including a plurality of current cells;
grouping a plurality of current cells of the current cell array into a plurality of groups;
assigning a first identifier to each of the groups of current cells and a second identifier to each of the current cells in each of the groups of current cells, the first and second identifiers based on a gradient of the initial current cell array;
arranging the current cells based on the first and second identifiers to provide a layout for a final current cell array;
storing the final current cell array layout in a computer readable storage medium;
and creating a mask for use in a photo process for fabricating the final current cell array according to the stored final current cell layout,
wherein the current cells are arranged in a first direction in accordance with the following:

$$M_K S_X = M_X' S_{K+X-1}', \text{ if } K+X-1 \leq N,$$

$$M_X S_X = M_X' S_{K+X-1-N}', \text{ if } K+X-1 > N$$

wherein
$M_X S_X$ identifies an initial position of a current cell,
$M_K' S_X'$ identifies a position of a current cell after being arranged in the first direction,
M identifies a group of current cells,
S identifies a current cell within a group of current cells,
K is the first identifier,
X is the second identifier, and
N is equal to the number of current cell groups and to the number of current cells per current cell group in the first direction.

8. The method of claim 7, further comprising:
fabricating the current cell array using the mask.

9. The method of claim 7, wherein the third identifier corresponds to a gradient of the initial current cell array in the second direction.

10. The method of claim 7, wherein each group includes N current cells in the first direction and in a second direction.

11. The method of claim 10, wherein the first identifier is for arranging the current cells in the first direction, the method further comprising:
assigning a third identifier to each of the current cells for arranging the current cells in the second direction.

12. The method of claim 11, wherein the current cells are arranged in the second direction in accordance with the following:

$$M_K' S_Y = M_K' S_{K'+Y-1}', \text{ if } K'+Y-1 \leq N$$

$$M_K' S_Y = M_K' S_{K'+Y-1-N}', \text{ if } K'+Y-1 > N$$

wherein
- K' is the first identifier after the current cells have been positioned in the first direction,
- Y is the third identifier, and
- N is equal to the number of current cell groups and the number of current cells per current cell group in the first and second directions.

13. A current cell array, comprising:

a number of current cell groups arranged such that they extend in a first direction, each of the current cell groups identified by a first identifier that increases in a direction of a gradient across the current cell array;

a number of current cells in each of the current cell groups, each of the current cells identified by a respective second identifier that increases in the direction of the gradient across the current cell array, wherein the current cells are positioned in the current cell groups based on the first and second identifiers, and the current cells are positioned in the current cell groups in the first direction in accordance with the following:

$$M_K S_X = M_{X'} S_{K+X-1}', \text{ if } K+X-1 \leq N,$$

$$M_K S_X = M_{X'} S_{K+X-1-N}', \text{ if } K+X-1 > N$$

wherein
- $M_K S_X$ identifies an initial position of a current cell,
- $M_{X'} S_{X'}'$ identifies a position of a current cell after being positioned in the first direction,
- M identifies a group of current cells,
- S identifies a current cell within a group of current cells,
- K is the first identifier,
- X is the second identifier, and
- N is equal to the number of current cell groups and to the number of current cells per current cell group in the first direction.

14. The current cell array of claim 13, wherein each current cell group includes N current cells in the first direction and in a second direction.

15. The current cell array of claim 14, wherein each of the current cells includes a third identifier for positioning the current cells in a second direction.

16. The current cell array of claim 15, wherein the current cells are positioned in the second direction in accordance with the following:

$$M_{K'} S_Y = M_{K'} S_{K'+Y-1}', \text{ if } K'+Y-1 \leq N$$

$$M_{K'} S_Y = M_{K'} S_{K'+Y-1-N}', \text{ if } K'+Y-1 > N$$

wherein
- K' is the first identifier after the current cells have been positioned in the first direction,
- Y is the third identifier, and
- N is equal to the number of current cell groups and the number of current cells per current cell group in the first and second directions.

17. A current cell array including a plurality of current cells, the current cell array formed by a method comprising:

providing an initial current cell array including the plurality of current cells extending in first and second directions;

grouping a first plurality of current cells of the current cell array into a plurality of groups, each of the groups including current cells extending in the first and second directions;

assigning a first identifier to each of the groups of current cells based on a respective position of each group of current cells with respect to a gradient of the initial current cell array in the first direction;

assigning a second identifier to each of the current cells in each of the groups of current cells based on a respective position of the current cell within a respective group of current cells with respect to the gradient in the first direction;

assigning a third identifier to each of the current cells in each of the groups of current cells based on a respective position of the current cell within a respective group of current cells with respect to a gradient in a second direction;

arranging the current cells in the first direction based on the first and second identifiers to provide an initial layout of the current cell array;

arranging the current cells in the second direction based on the first and third identifiers to provide a final layout of the current cell array; and storing the final layout of the current cell array in a computer readable storage medium, wherein the current cells are arranged in the first direction in accordance with the following:

$$M_K S_X = M_{X'} S_{K+X-1}', \text{ if } K+X-1 \leq N,$$

$$M_K S_X = M_{X'} S_{K+X-1-N}', \text{ if } K+X-1 > N$$

wherein
- $M_K S_X$ identifies an initial position of a current cell,
- $M_{K'} S_{X'}'$ identifies a position of a current cell after being arranged in the first direction,
- M identifies a group of current cells,
- S identifies a current cell within a group of current cells,
- K is the first identifier,
- X is the second identifier, and
- N is equal to the number of current cell groups and to the number of current cells per current cell group in the first direction.

18. The current cell array of claim 17, wherein the current cells are arranged in the second direction in accordance with the following:

$$M_{K'} S_Y = M_{K'} S_{K'+Y-1}', \text{ if } K'+Y-1 \leq N$$

$$M_{K'} S_Y = M_{K'} S_{K'+Y-1-N}', \text{ if } K'+Y-1 > N$$

wherein
- K' is the first identifier after the current cells have been positioned in the first direction,
- Y is the third identifier, and
- N is equal to the number of current cell groups and the number of current cells per current cell group in the first and second directions.

19. The current cell array of claim 18, further comprising:

creating a mask for use in a photo process for fabricating the current cell array according to the stored final layout; and fabricating the current cell array using the mask.

20. The current cell array of claim 17, wherein N is greater than two.

* * * * *